US009324545B2

(12) United States Patent
Green et al.

(10) Patent No.: US 9,324,545 B2
(45) Date of Patent: Apr. 26, 2016

(54) CALIBRATING DUAL ADC ACQUISITION SYSTEM

(71) Applicant: Micromass UK Limited, Wilmslow (GB)

(72) Inventors: Martin Raymond Green, Bowdon (GB); Jason Lee Wildgoose, Stockport (GB)

(73) Assignee: Micromass UK Limited, Wilmslow (GB)

(*) Notice: Subject to any disclaimer, the term of this patent is extended or adjusted under 35 U.S.C. 154(b) by 0 days.

(21) Appl. No.: 14/401,738

(22) PCT Filed: May 16, 2013

(86) PCT No.: PCT/GB2013/051270
§ 371 (c)(1),
(2) Date: Nov. 17, 2014

(87) PCT Pub. No.: WO2013/171500
PCT Pub. Date: Nov. 21, 2013

(65) Prior Publication Data
US 2015/0136971 A1 May 21, 2015

Related U.S. Application Data

(60) Provisional application No. 61/651,251, filed on May 24, 2012.

(30) Foreign Application Priority Data

May 18, 2012 (GB) .................................. 1208841.5

(51) Int. Cl.
*H01J 49/40* (2006.01)
*H01J 49/02* (2006.01)
(Continued)

(52) U.S. Cl.
CPC ............ *H01J 49/022* (2013.01); *H01J 49/0009* (2013.01); *H01J 49/0036* (2013.01); *H01J 49/025* (2013.01); *H03M 1/0836* (2013.01); *H03M 1/188* (2013.01)

(58) Field of Classification Search
CPC ..... H01J 49/0036; H01J 49/40; H01J 49/025; H01J 49/0009; H01J 49/022; H01J 49/00; H01J 49/0027; H01J 49/02; H01J 49/401; H03M 1/0836; H03M 1/188; G01N 30/72; G01N 30/8631
USPC .............. 250/282, 281, 287, 288, 283, 252.1, 250/289, 290, 291, 292, 286
See application file for complete search history.

(56) References Cited

U.S. PATENT DOCUMENTS 6,195,031 B1    2/2001  Feld et al.
6,229,142 B1 *  5/2001  Bateman et al. ............... 250/287
(Continued)

FOREIGN PATENT DOCUMENTS

WO       2013/171500       11/2013

OTHER PUBLICATIONS

Gusev et al., "Improvement of Signal Reproducibility and Matrix/Comatrix Effects in MALDI Analysis", Analytical Chemistry, vol. 67, No. 6, pp. 1034-1041, 1995.

*Primary Examiner* — David A Vanore
(74) *Attorney, Agent, or Firm* — Diederiks & Whitelaw, PLC

(57) ABSTRACT

A method of calibrating a dual gain ADC detector system is disclosed comprising passing a test signal through a high gain signal path to produce a first signal and passing a test signal through a low gain signal path to produce a second signal. A time difference between the first signal and the second signal is then determined. Data from the two ADCs is then stitched to form a composite mass spectrum without needing to correct the phase between the two ADCs.

31 Claims, 8 Drawing Sheets

(51) Int. Cl.
*H01J 49/00* (2006.01)
*G01N 30/72* (2006.01)
*H03M 1/18* (2006.01)
*H03M 1/08* (2006.01)

(56) References Cited

U.S. PATENT DOCUMENTS

| | | | |
|---|---|---|---|
| 6,567,022 B1 | 5/2003 | Reuveni et al. | |
| 7,238,936 B2 | 7/2007 | Okamura et al. | |
| 7,423,259 B2 | 9/2008 | Hidalgo et al. | |
| 7,501,621 B2 * | 3/2009 | Willis et al. | 250/287 |
| 7,982,181 B1 * | 7/2011 | Senko | 250/282 |
| 8,063,360 B2 | 11/2011 | Willis et al. | |
| 8,354,634 B2 | 1/2013 | Green et al. | |
| 8,508,397 B2 | 8/2013 | Hisch | |
| 8,658,971 B2 * | 2/2014 | Green et al. | 250/287 |
| 8,872,104 B2 * | 10/2014 | Langridge et al. | 250/282 |
| 2010/0213361 A1 * | 8/2010 | Green et al. | 250/252.1 |
| 2011/0049353 A1 * | 3/2011 | Gilbert et al. | 250/282 |
| 2013/0268212 A1 | 10/2013 | Makarov et al. | |
| 2013/0317756 A1 * | 11/2013 | Richardson et al. | 702/23 |

* cited by examiner

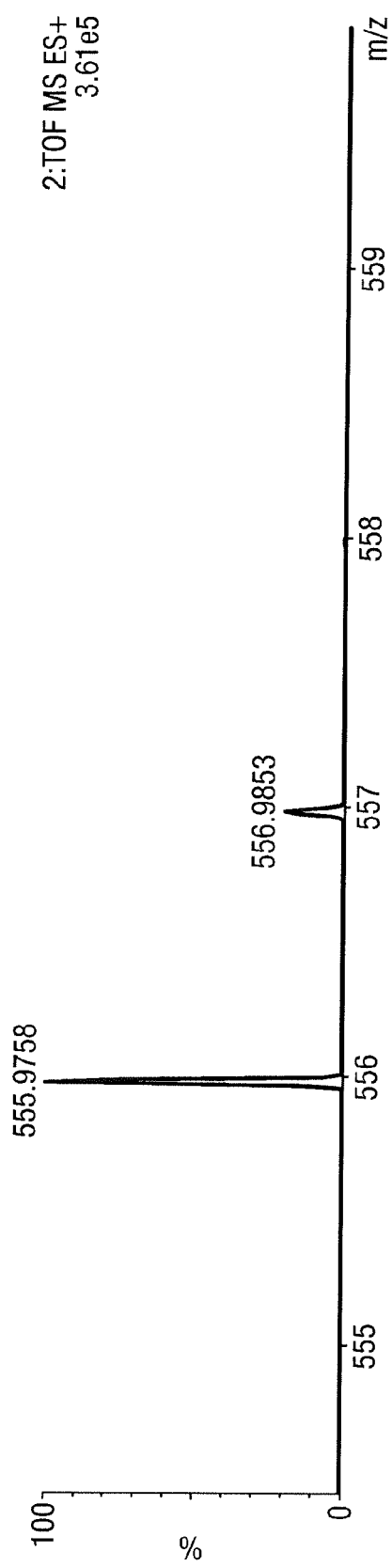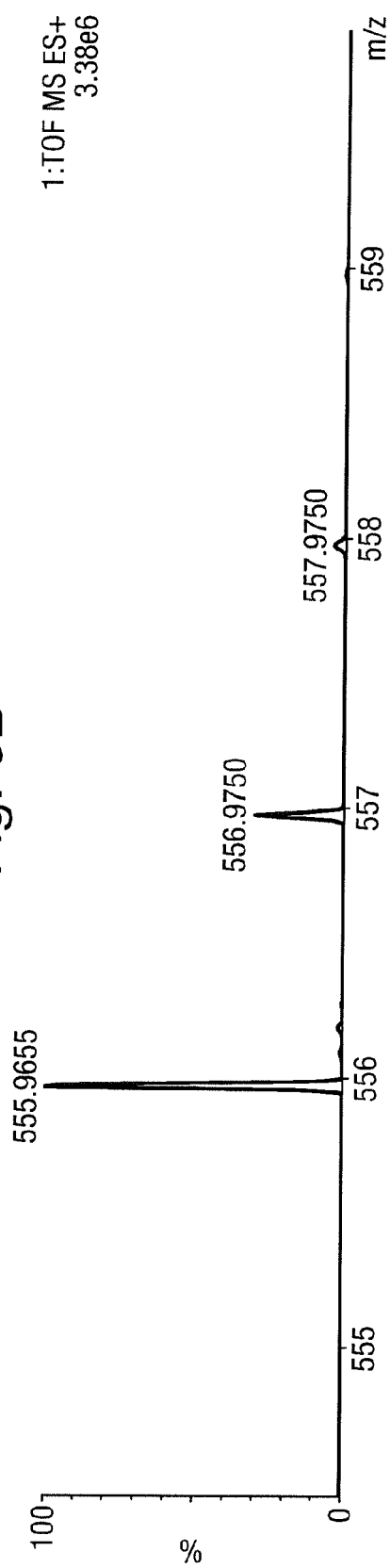

CALIBRATING DUAL ADC ACQUISITION SYSTEM

CROSS REFERENCE TO RELATED APPLICATIONS

This application is the National Stage of International Application No. PCT/GB2013/051270 filed on 16 May 2013, which claims priority from and the benefit of U.S. Provisional Patent Application Ser. No. 61/651,251 filed on 24 May 2012 and United Kingdom Patent Application No. 1208841.5 filed on 18 May 2012. The entire contents of these applications are incorporated herein by reference.

BACKGROUND OF THE PRESENT INVENTION

The present invention relates to a mass spectrometer and method of mass spectrometry. The preferred embodiment relates to a method of calibrating a dual gain ADC detector system.

U.S. Pat. No. 7,423,259 (Hidalgo) discloses a method of operating a dual gain ADC in which the signal from a mass spectrometer is split and directed to two independent amplifiers of different gains. The two amplified signals are digitized using two independent analogue to digital recording devices. The resultant data is sent to a spectral combiner which combines the data after appropriate intensity scaling such that digitized samples from the higher gain amplifier signal path with intensities which exceed the vertical dynamic range of the ADC are replaced with the corresponding digitised samples from the low gain sample path. This composite spectrum has a dynamic range greater than either individual ADC.

In order for this approach to work correctly the time sampling intervals of both the ADCs must be correctly aligned. It is known to use firmware or complex electronics to correct the phase between two ADCs in order to align the time sampling intervals prior to the signal being digitized.

However, in addition to aligning the two ADC clocks it is also necessary to align the signal itself such that each digitized point in the two signal paths corresponds to the same region of the ion signal before individual digitized points are chosen to represent the final signal. This alignment of the signal also adds significant complexity to dual ADC operation.

It will be understood by those skilled in the art that correcting the phase between two ADCs is limited to situations wherein the phase difference between the two ADC clocks is typically less than one ADC time bin e.g. <100 ps.

U.S. Pat. No. 6,567,022 (Reuveni) discloses a method of calibrating the vertical gain and offset differences of two ADCs using a test signal. The disclosed method relates to a calibration routine to compensate for the natural variation in output amplitude response of two substantially identical ADCs when digitising the same test signal. This process is performed to allow two ADCs to be interleaved successfully to produce a single output of apparent higher digitization rate. No time correction is performed, no compensation for dual signal paths with different amplification stages is described and no dynamic range enhancement is intended.

US 2010/0213361 (Micromass) discloses a dual gain ADC method for increasing the dynamic range of a Time of Flight system wherein the signal from ion arrivals at the detector is split and sent via two amplifiers of different gain and then to two separate ADCs to be digitized. The disclosed method advantageously does not require phase correcting of the ADC clocks. According to the disclosed method the data from each push is reduced to time and intensity pairs and then combined onto a time axis which is independent of the original ADC digitisation rate. This approach allows up-sampling of the combined data from the two ADCs using finer time bins than the ADC during combining. No alignment of the signal prior to digitization is required. The method disclosed in US 2010/0213361 is therefore particularly advantageous in that the detector system does not require complex phase correction electronics.

WO 2008/008867 (Mason) discloses injecting a test pulse to adjust the phase, offset or gain of the output channels of a preamplifier having two output channels. The first output channel has a gain of eight times that of the second output channel. Two digitised data streams are stitched ADC bin to ADC bin for an individual time of flight transient before summing to produce a single high dynamic range spectra. The phase difference between the two ADCs is adjusted or corrected to zero such that the bin intervals on each ADC line up and the signal falls over the same bins in both ADCs.

To line up the ADC time bins (i.e. phase correct), an onboard ADC delay is adjusted based on the measurement of the test signal. However, this onboard delay is only capable of adjusting the phase or delay by one or two digitisation bin widths i.e. approx. 100 ps and any attempts to make larger adjustments to this delay will cause phase noise and hence timing jitter in the final signal. The disclosed method therefore only allows correction of the phase difference between the two ADCs and is not suitable for addressing the problem of significantly longer time delays due to propagation delays between the two signal paths through the two amplifiers which may be substantially greater than the onboard ADC delay can cope with.

It will be apparent that the cables of the amplifier and the ADC signal paths for the two gain channels must be very carefully designed with as close to zero phase difference as possible, such that the only correction which is needed is between the two ADCs and this is a matter of only a few ps. It will understood by those skilled in the art that such design constraints result in complex and expensive ADC detector systems and associated electronics. Furthermore, if it desired to change the amplification then a whole new circuit must be designed.

A general problem with known dual ADC systems is that due to differences in cable lengths and propagation delays through the different amplifier circuits and other components etc. there is generally a difference in recorded time between the signal passing through high and low gain signal paths even though the signal originates from the same ion arrival event at the detector. This is generally a time offset and such a time offset (typically of 10-500 ns) due to propagation delay can not be corrected by phase correcting the two ADCs (which is only able to align ADCs by approx. 100 ps).

If the two signal paths are not calibrated or aligned before the signal is combined into a final spectrum then there will be resultant loss in mass resolution and or mass accuracy in the final combined data.

In addition, although the nominal theoretical gain of the amplification circuit in each signal path may be known, in practice the actual gain or gain difference may be different. If the gain ratio used in this normalization is in error there will be quantitative errors in the final combined spectrum.

In summary, conventional dual gain ADC systems are only able to align ADC clocks by phase correcting for timing differences of up to approx. 100 ps. Conventional dual gain ADC systems require that the signal path through both ADCs is substantially identical. This requirement imposes significant design constraints and also requires complex associated electronics.

It is therefore desired to provide an improved dual gain ADC detector system for a mass spectrometer.

SUMMARY OF THE PRESENT INVENTION

According to an aspect of the present invention there is provided a method of mass spectrometry comprising:

passing a test signal multiple times through a first signal path of a dual gain ADC detector system to produce first digitised test signals, processing each first digitised test signal to detect a first test peak, determining a time or other value and an intensity value corresponding to each first test peak, histogramming or combining each time or other value and the intensity value to form a first histogram or combined data set and determining a first time T1 for the first signal path from the first histogram or combined data set;

passing a test signal multiple times through a second signal path of the dual gain ADC detector system to produce second digitised test signals, processing each second digitised test signal to detect a second test peak, determining a time or other value and an intensity value corresponding to each second test peak, histogramming or combining each time or other value and the intensity value to form a second histogram or combined data set and determining a second time T2 for the second signal path from the second histogram or combined data set; and determining a time difference ΔT between the first time T1 and the second time T2.

An important advantage of the present invention is that a dual ADC detector system is provided which does not need to be designed so that there is no propagation delay between the two signal paths passing through the two ADCs. Furthermore, the two ADCs do not need to be phase corrected and hence complex and expensive electronics for phase correcting the two ADCs is not required.

The present invention therefore enables a less complex and less expensive dual gain ADC detector system to be provided and also allows the relative gain between the two ADCs paths to be easily altered (in contrast to conventional dual gain ADC systems where the gain of the two ADC paths can not be readily altered).

It will be appreciated by those skilled in the art that phase correction approaches such as that disclosed in WO 2008/008867 (Mason) require complex and very carefully designed ADC circuitry. Phase correction is only able to correct for very slight timing errors of the order of 100 ps and imposes strict requirements on the ADC circuitry so that there is essentially no propagation delay between the two ADC paths. The approach disclosed in WO 2008/008867 (Mason) is therefore unable to correct for significant timing or propagation delays of the order of 1-100 ns due to a difference in time for a signal to pass through two signal paths.

According to the present invention it is not necessary to phase correct the two ADCs. Instead, according to the present invention the time offset between the signals from the two signal paths is measured and is subsequently corrected for. It is not necessary to phase correct the two ADCs as the data is reduced to time and intensity pairs before combining.

A particular advantage of the present invention is that it is possible to compensate for large differences in propagation times as the correction is preferably applied as a post processing operation in a FPGA which reduces the requirement for highly matched upstream electronics and significantly simplifies the overall design of the dual ADC system.

Furthermore, the design of the ADCs may be easily changed (e.g. the relative gain may be easily changed) and the system can be easily re-calibrated as according to the present invention a relative shift in the signal itself can easily be compensated for.

In a similar manner, the gain can be measured and then according to the preferred embodiment the multiplication factor for the weak or low gain data may be adjusted accordingly. It is not therefore necessary to set a precise gain factor between the two ADCs. In contrast, the arrangement disclosed in WO 2008/008867 is only able to adjust the gain of the ADC using the onboard facility so that it matches the required gain difference. The maximum adjustment possible using this approach is approx. +10% of the gain of the ADC.

In contrast, according to the preferred embodiment the gain is measured and any gain difference (c.f. just up to 10%) can be accommodated. Accordingly, the detector system according to the preferred embodiment is a much more flexible system than that disclosed in WO 2008/008867 and utilises a simpler amplifier design which significantly reduces the overall cost of the dual ADC system.

In summary, a phase correction approach such as disclosed in WO 2008/008867 is complex, imposes very strict requirements in terms of amplifier design and requires complex electronics. The system is only able to make very fine adjustments (<100 ps) using the onboard ADC functionality.

In contrast, the present invention is inherently simpler and more flexible. Field Programmable Gate Arrays ("FPGAs") are preferably used to compensate for the differences in the two signal paths (which may be of the order of 1-500 ns) and to measure the gain difference in post processing.

The present invention therefore represents a significant improvement over conventional arrangements as disclosed, for example, in WO 2008/008867.

The arrangement disclosed in WO 2008/008867 does not pass multiple test signals through both ADCs and then histogram the time and intensity values of test peaks and then determine a propagation delay between the two signal paths based upon the two histograms.

The first signal path preferably comprises a low gain signal path.

The second signal path preferably comprises a high gain signal path.

A signal passing along the first signal path is preferably multiplied or amplified by a first gain.

A signal passing along the second signal path is preferably multiplied or amplified by a second different gain.

The second gain is preferably greater than the first gain.

According to an embodiment either:

(a) the ratio of the second gain to the first gain is selected from the group consisting of: (i) <2; (ii) 2-5; (iii) 5-10; (iv) 10-15; (v) 15-20; (vi) 20-25; (vii) 25-30; (viii) 30-35; (ix) 35-40; (x) 40-45; (xi) 45-50; (xii) 50-60; (xiii) 60-70; (xiv) 70-80; (xv) 80-90; (xvi) 90-100; and (xvii) >100; or (b) the ratio of the first gain to the second gain is selected from the group consisting of: (i) <2; (ii) 2-5; (iii) 5-10; (iv) 10-15; (v) 15-20; (vi) 20-25; (vii) 25-30; (viii) 30-35; (ix) 35-40; (x) 40-45; (xi) 45-50; (xii) 50-60; (xiii) 60-70; (xiv) 70-80; (xv) 80-90; (xvi) 90-100; and (xvii) >100.

The method preferably further comprises detecting analyte ions using an ion detector.

The method preferably further comprises outputting a first signal and a second signal from the ion detector, wherein the first signal corresponds with a signal multiplied or amplified by a first gain and the second signal corresponds with a signal multiplied or amplified by a second different gain.

The method preferably further comprises digitising the first signal to produce a first digitised signal and digitising the second signal to produce a second digitised signal.

The method preferably further comprises detecting one or more first peaks in the first digitised signal and detecting one or more second peaks in the second digitised signal.

The method preferably further comprises marking or flagging first peaks and/or second peaks which are determined to suffer from saturation.

The method preferably further comprises determining an intensity value and an arrival time or other value for each of the first peaks.

The method preferably further comprises correcting the determined arrival time or other value of each of the first peaks based upon the time difference $\Delta T$.

The method preferably further comprises determining an intensity value and an arrival time or other value for each of the second peaks.

The method preferably further comprises correcting the determined arrival time or other value of each the second peaks based upon the time difference $\Delta T$.

The method preferably further comprises forming a combined data set comprising intensity values and arrival time or other values of each of the second peaks which are not marked or flagged as suffering from saturation and intensity values and arrival time or other values of first peaks when corresponding second peaks are marked or flagged as suffering from saturation.

The method preferably further comprises correcting the determined arrival time or other value of each of the first peaks based upon the time difference $\Delta T$.

The method preferably further comprises correcting the determined arrival time or other value of each of the second peaks based upon the time difference $\Delta T$.

The method preferably further comprises scaling intensity values of the first peaks by a scale factor.

The scale factor preferably corresponds with the ratio of the second gain to the first gain.

The method preferably further comprises histogramming or combining the intensity values and arrival time or other values in the combined data set with other intensity values and arrival time or other values to form a mass spectrum.

According to an embodiment the method further comprises summing the first digitised signal with a plurality of other corresponding first digitised signals to form a first summed digitised signal and summing the second digitised signal with a plurality of other corresponding second digitised signals to form a second summed digitised signal.

The method preferably further comprises determining a first summed intensity value and a first summed arrival time or other value from the first summed digitised signal.

The method preferably further comprises determining a second summed intensity value and a second summed arrival time or other value from the second summed digitised signal.

The method preferably further comprises either: (i) marking or flagging first digitised signals and/or second digitised signals which are determined to suffer from saturation; and/or (ii) marking or flagging first summed intensity values and/or second summed intensity values which are determined to suffer from saturation.

The method preferably further comprises correcting the first summed arrival times or other values based upon the time difference $\Delta T$.

The method preferably further comprises correcting the second summed arrival times or other values based upon the time difference $\Delta T$.

The method preferably further comprises forming a combined data set comprising second summed intensity values and second summed arrival time or other values which are not marked or flagged as suffering from saturation and first summed intensity values and first summed arrival time or other values when corresponding second digitised signals or second summed intensity values are marked or flagged as suffering from saturation.

The method preferably further comprises correcting the first summed arrival times or other values based upon the time difference $\Delta T$.

The method preferably further comprises correcting the second summed arrival times or other values based upon the time difference $\Delta T$.

The method preferably further comprises scaling the first summed intensity values by a scale factor. The scale factor preferably corresponds with the ratio of the second gain to the first gain.

The method preferably further comprises histogramming or combining the intensity values and arrival time or other values in the combined data set with other intensity values and arrival time or other values to form a mass spectrum.

The step of outputting the first signal and the second signal preferably comprises converting, splitting or dividing a signal output from the ion detector into the first signal and the second signal.

The steps of digitising the first signal and digitising the second signal are preferably performed substantially simultaneously.

The step of digitising the first signal preferably comprises using a first Analogue to Digital Converter to digitise the first signal and the step of digitising the second signal preferably comprises using a second different Analogue to Digital Converter to digitise the second signal.

The first Analogue to Digital Converter and/or the second Analogue to Digital Converter are preferably arranged to convert an analogue voltage to a digital output and wherein the first Analogue to Digital Converter and/or the second Analogue to Digital Converter are arranged:

(a) to operate, in use, at a digitisation rate selected from the group consisting of: (i) <1 GHz; (ii) 1-2 GHz; (iii) 2-3 GHz; (iv) 3-4 GHz; (v) 4-5 GHz; (vi) 5-6 GHz; (vii) 6-7 GHz; (viii) 7-8 GHz; (ix) 8-9 GHz; (x) 9-10 GHz; and (xi) >10 GHz; and/or (b) to have a resolution selected from the group consisting of: (i) at least 4 bits; (ii) at least 5 bits; (iii) at least 6 bits; (iv) at least 7 bits; (v) at least 8 bits; (vi) at least 9 bits; (vii) at least 10 bits; (viii) at least 11 bits; (ix) at least 12 bits; (x) at least 13 bits; (xi) at least 14 bits; (xii) at least 15 bits; and (xiii) at least 16 bits.

The method preferably further comprises determining an intensity difference or ratio between the first signal and the second signal.

The method preferably further comprises using the determined intensity difference or ratio to correct subsequent intensity data produced by the dual gain ADC detector system.

According to the preferred embodiment signals output from the first Analogue to Digital Converter are not phase corrected with signals output from the second Analogue to Digital Converter.

The test signal preferably has a line width and/or line shape similar to an ion arrival signal.

The method preferably further comprises using a single ion detector to detect analyte ions.

The time difference $\Delta T$ is preferably selected from the group consisting of: (i) 1-10 ns; (ii) 10-20 ns; (iii) 20-30 ns; (iv) 30-40 ns; (v) 40-50 ns; (vi) 50-60 ns; (vii) 60-70 ns; (viii) 70-80 ns; (ix) 80-90 ns; (x) 90-100 ns; (xi) 100-200 ns; (xii) 200-300 ns; (xiii) 300-400 ns; (xiv) 400-500 ns; (xv) 500-600 ns; (xvi) 600-700 ns; (xvii) 700-800 ns; (xviii) 800-900 ns; (xix) 900-1000 ns; and (xx) >1 ps.

Conventional arrangements such as the one disclosed in WO 2008/008867 are unable to determine a propagation time delay of the order >1 ns. ADC time bins which are misaligned by only one or two time bins (e.g. up to 100 ps) may conventionally be aligned by phase correcting the two ADCs.

According to an aspect of the present invention there is provided a dual gain ADC detector system comprising:
a first signal path;
a second signal path; and
a control system arranged and adapted:
(i) to pass a test signal multiple times through the first signal path to produce first digitised test signals;
(ii) to process each first digitised test signal to detect a first test peak;
(iii) to determine a time or other value and an intensity value corresponding to each the test peak;
(iv) to histogram or combine each time or other value and the intensity value to form a first histogram or combined data set;
(v) to determine a first time T1 for the first signal path from the first histogram or combined data set;
(vi) to pass a test signal multiple times through the second signal path to produce second digitised test signals;
(vii) to process each second digitised test signal to detect a second test peak;
(viii) to determine a time or other value and an intensity value corresponding to each second test peak;
(ix) to histogram or combine each time or other value and the intensity value to form a second histogram or combined data set;
(x) to determine a second time T2 for the second signal path from the second histogram or combined data set; and
(xi) to determine a time difference ΔT between the first time T1 and the second time T2.

The arrangement disclosed in WO 2008/008867 does not pass multiple test signals through both ADCs and then histogram the time and intensity values of test peaks and then determine a propagation delay between the two signal paths based upon two histograms.

According to an aspect of the present invention there is provided a method of mass spectrometry comprising:
providing a dual gain ADC detector system comprising a first signal path comprising a first Analogue to Digital Converter and a second signal path comprising a second Analogue to Digital Converter;
passing a test signal through the first signal path and passing a test signal through the second signal path to determine a propagation time delay ΔT between the first signal path and the second signal path, wherein ΔT>1 ns; and
detecting analyte ions using the dual gain ADC detector system without correcting the phase between the first Analogue to Digital Converter and the second Analogue to Digital Converter.

The arrangement disclosed in WO 2008/008867 is unable to determine a propagation time delay of the order >1 ns. ADC time bins which are misaligned by only one or two time bins e.g. up to 100 ps are aligned by phase correcting the two ADCs.

The first signal path preferably has a first gain and the second signal path has a second higher gain.

The method preferably further comprises providing an ion detector wherein the step of detecting the analyte ions comprises digitising a first signal output from the ion detector which passes along the first signal path and determining first time and intensity pairs in relation to peaks in the first signal and digitising a second signal output from the ion detector which passes along the second signal path and determining second time and intensity pairs in relation to peaks in the second signal.

The method preferably further comprises forming a mass spectrum by selecting the second time and intensity pairs unless a second time and intensity pair is determined to suffer from saturation whereupon a corresponding first time and intensity pair is selected instead.

According to the preferred embodiment if a first time and intensity pair is selected instead of a second time and intensity pair then an intensity value of the first time and intensity pair is scaled by a scale factor which substantially corresponds with the ratio of the second gain to the first gain.

The method preferably further comprises digitising an ion peak across multiple ADC time bins and converting the digitised ion peak into a single time and intensity pair, wherein the time value of the time and intensity pair corresponds with a centroid or weighted centroid of the digitised ion peak.

According to an aspect of the present invention there is provided a mass spectrometer comprising:
a dual gain ADC detector system comprising a first signal path comprising a first Analogue to Digital Converter and a second signal path comprising a second Analogue to Digital Converter; and
a control system arranged and adapted:
(i) to pass a test signal through the first signal path and to pass a test signal through the second signal path to determine a propagation time delay ΔT between the first signal path and the second signal path, wherein ΔT>1 ns; and
(ii) to detect analyte ions using the dual gain ADC detector system without correcting the phase between the first Analogue to Digital Converter and the second Analogue to Digital Converter.

The arrangement disclosed in WO 2008/008867 is unable to determine a propagation time delay of the order >1 ns. ADC time bins which are misaligned by only one or two time bins e.g. up to 100 ps are aligned by phase correcting the two ADCs.

According to an aspect of the present invention there is provided a method of calibrating a dual gain ADC detector system comprising:
passing a test signal through a high gain signal path to produce a first signal;
passing a test signal through a low gain signal path to produce a second signal; and
determining a time difference between the first signal and the second signal.

The method preferably further comprises:
digitising the first signal to produce a first digitised signal and digitising the second signal to produce a second digitised signal;
wherein the step of determining a time difference between the first signal and the second signal comprises determining a time difference between the first digitised signal and the second digitised signal.

The method preferably further comprises:
processing the first digitised signal to detect one or more first peaks; and
processing the second digitised signal to detect one or more second peaks;
wherein the step of determining a time difference between the first signal and the second signal comprises determining a time difference between the one or more first peaks and the one or more second peaks.

The method preferably further comprises:

summing the first digitised signal with a plurality of other corresponding first digitised signals to form a first summed digitised signal;

summing the second digitised signal with a plurality of other corresponding second digitised signals to form a second summed digitised signal;

processing the first summed digitised signal to detect one or more first peaks; and processing the second summed digitised signal to detect one or more second peaks;

wherein the step of determining a time difference between the first signal and the second signal comprises determining a time difference between the one or more first peaks and the one or more second peaks.

The method preferably further comprises:

combining the first digitised signal and the second digitised signal to form a combined digitised signal; and processing the combined digitised signal to detect one or more first peaks and one or more second peaks;

wherein the step of determining a time difference between the first signal and the second signal comprises determining a time difference between the one or more peaks and the one or more second peaks.

The method preferably further comprises:

combining the first digitised signal and the second digitised signal to form a combined digitised signal;

summing the combined digitised signal with a plurality of other corresponding combined digitised signals to form a summed combined digitised signal;

processing the summed combined digitised signal to detect one or more first peaks and one or more second peaks;

wherein the step of determining a time difference between the first signal and the second signal comprises determining a time difference between the one or more peaks and the one or more second peaks.

The method preferably further comprises:

producing one or more first time and intensity pairs from the one or more first detected peaks; and producing one or more second time and intensity pairs from the one or more second detected peaks;

wherein the step of determining a time difference between the first signal and the second signal comprises determining a time difference between the one or more first time and intensity pairs and the one or more second time and intensity pairs.

The method preferably further comprises:

using the determined time difference to correct subsequent intensity and arrival time, mass or mass to charge ratio data produced by the dual gain ADC detector system.

The method preferably further comprises:

determining an intensity difference or ratio between the first signal and the second signal.

The method preferably further comprises:

using the determined intensity difference or ratio to correct subsequent intensity and arrival time, mass or mass to charge ratio data produced by the dual gain ADC detector system.

The method preferably further comprises:

converting, splitting or dividing a test signal into at least a first portion of the test signal and a second portion of the test signal;

wherein the step of passing a test signal through the high gain signal path comprises passing the first portion of the test signal through the high gain signal path; and wherein the step of passing a test signal through the low gain signal path comprises passing the second portion of the test signal through the low gain signal path.

According to the preferred embodiment the first portion of the test signal and the second portion of the test signal have substantially the same intensity.

According to the preferred embodiment the first signal corresponds with a test signal multiplied or amplified by a first gain and the second signal corresponds with a test signal multiplied or amplified by a second different gain.

The first gain is preferably substantially greater than the second gain.

The test signal preferably comprises one or more peaks.

The one or more peaks preferably have a line width and/or line shape similar to an ion arrival signal.

The step of digitising the first signal and digitising the second signal preferably comprises digitising the first signal and digitising the second signal using one or more Analogue to Digital Converters.

The method preferably further comprises selecting the intensity of the test signal such that the first signal and/or the second signal does not saturate the one or more Analogue to Digital Converters.

The method preferably further comprises selecting the intensity of the test signal such that the first signal is close to saturating the one or more Analogue to Digital Converters.

The method preferably further comprises:

outputting a signal from a signal generator to provide the test signal; or outputting a signal from a mass spectrometer to provide the test signal.

According to another aspect of the present invention there is provided a dual gain ADC detector system comprising:

a device arranged and adapted to pass a test signal through a high gain signal path to produce a first signal;

a device arranged and adapted to pass a test signal through a low gain signal path to produce a second signal; and a device arranged and adapted to determine a time difference between the first signal and the second signal.

According to another aspect of the present invention there is provided a method of calibrating a dual gain ADC detector system comprising:

determining a time difference between a signal passing through a high gain and a low gain signal path.

According to another aspect of the present invention there is provided a dual gain ADC detector system comprising:

a device arranged and adapted to determine a time difference between a signal passing through a high gain and a low gain signal path.

According to an aspect of the present invention there is provided a method of correcting timing differences and amplitude differences of similar signals taking different signal paths used in conjunction with one or more analogue to digital converter ADC recording device used to record ion arrivals from a Time of Flight mass spectrometer. The preferred method comprises the steps of: (i) providing a test signal such that the signal traverses at least that part of the signal path which is unique and corresponds to the path taken by a signal arising from an ion arrival at the detector; (ii) digitising each test signal after it has traversed these unique signal paths; (iii) peak detecting the digitized signal to determine arrival times and intensities; (iv) calculating a correction factor to correct for differences in the calculated times between signal paths; (v) calculating a correction factor to correct for the difference in calculated intensity between the different signal paths; and (vi) applying these correction factors to subsequent real peak detected ion arrival signals.

A preferred embodiment of the present invention provides a simple method of aligning or calibrating the output from two independent ADCs used to record time of flight data according to the method described in US 2010/0213361, without having to use calibrant and avoiding the necessity to synchronize or phase correct the clocks of the two ADCs.

The preferred embodiment of the present invention allows rapid, accurate, automatic calibration of a dual channel ADC system without having to ionize and analyse a calibration sample.

According to an embodiment the mass spectrometer may further comprise:

(a) an ion source selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; (xx) a Glow Discharge ("GD") ion source; (xxi) an Impactor ion source; (xxii) a Direct Analysis in Real Time ("DART") ion source; (xxiii) a Laserspray Ionisation ("LSI") ion source; (xxiv) a Sonicspray Ionisation ("SSI") ion source; (xxv) a Matrix Assisted Inlet Ionisation ("MAII") ion source; and (xxvi) a Solvent Assisted Inlet Ionisation ("SAII") ion source; and/or (b) one or more continuous or pulsed ion sources; and/or (c) one or more ion guides; and/or (d) one or more ion mobility separation devices and/or one or more Field Asymmetric Ion Mobility Spectrometer devices; and/or (e) one or more ion traps or one or more ion trapping regions; and/or (f) one or more collision, fragmentation or reaction cells selected from the group consisting of: (i) a Collisional Induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("PID") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device; (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions; (xxvii) an ion-metastable molecule reaction device for reacting ions to form adduct or product ions; (xxviii) an ion-metastable atom reaction device for reacting ions to form adduct or product ions; and (xxix) an Electron Ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser; (v) an ion trap mass analyser; (vi) a magnetic sector mass analyser; (vii) Ion Cyclotron Resonance ("ICR") mass analyser; (viii) a Fourier Transform Ion Cyclotron Resonance ("FTICR") mass analyser; (ix) an electrostatic or orbitrap mass analyser; (x) a Fourier Transform electrostatic or orbitrap mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wien filter; and/or (k) a device or ion gate for pulsing ions; and/or (l) a device for converting a substantially continuous ion beam into a pulsed ion beam.

The mass spectrometer may further comprise either:

(i) a C-trap and an orbitrap (RTM) mass analyser comprising an outer barrel-like electrode and a coaxial inner spindle-like electrode, wherein in a first mode of operation ions are transmitted to the C-trap and are then injected into the orbitrap (RTM) mass analyser and wherein in a second mode of operation ions are transmitted to the C-trap and then to a collision cell or Electron Transfer Dissociation device wherein at least some ions are fragmented into fragment ions, and wherein the fragment ions are then transmitted to the C-trap before being injected into the orbitrap (RTM) mass analyser; and/or (ii) a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

According to an embodiment the mass spectrometer further comprises a device arranged and adapted to supply an AC or RF voltage to the electrodes. The AC or RF voltage preferably has an amplitude selected from the group consisting of: (i) <50 V peak to peak; (ii) 50-100 V peak to peak; (iii) 100-150 V peak to peak; (iv) 150-200 V peak to peak; (v) 200-250 V peak to peak; (vi) 250-300 V peak to peak; (vii) 300-350 V peak to peak; (viii) 350-400 V peak to peak; (ix) 400-450 V peak to peak; (x) 450-500 V peak to peak; and (xi) >500 V peak to peak.

The AC or RF voltage preferably has a frequency selected from the group consisting of: (i) <100 kHz; (ii) 100-200 kHz; (iii) 200-300 kHz; (iv) 300-400 kHz; (v) 400-500 kHz; (vi) 0.5-1.0 MHz; (vii) 1.0-1.5 MHz; (viii) 1.5-2.0 MHz; (ix) 2.0-2.5 MHz; (x) 2.5-3.0 MHz; (xi) 3.0-3.5 MHz; (xii) 3.5-4.0 MHz; (xiii) 4.0-4.5 MHz; (xiv) 4.5-5.0 MHz; (xv) 5.0-5.5 MHz; (xvi) 5.5-6.0 MHz; (xvii) 6.0-6.5 MHz; (xviii) 6.5-7.0 MHz; (xix) 7.0-7.5 MHz; (xx) 7.5-8.0 MHz; (xxi) 8.0-8.5 MHz; (xxii) 8.5-9.0 MHz; (xxiii) 9.0-9.5 MHz; (xxiv) 9.5-10.0 MHz; and (xxv) >10.0 MHz.

BRIEF DESCRIPTION OF THE DRAWINGS

Various embodiments of the present invention will now be described, by way of example only, and with reference to the accompanying drawings in which:

FIG. 6A shows a mass spectrum for the low gain signal path and FIG. 6B shows a mass spectrum for the high gain signal path;

DETAILED DESCRIPTION OF PREFERRED EMBODIMENTS

A preferred embodiment of the present invention will now be described and relates to injecting a test signal in a dual ADC detector system. The test signal traverses the part of the signal path which is unique to each ADC input.

The test signal is preferably peak detected to produce time and intensity pairs for the portion of the signal which travels along the high gain amplifier signal path and time and intensity pairs for the portion of the signal which travels along the low gain amplifier path.

Figure 1:
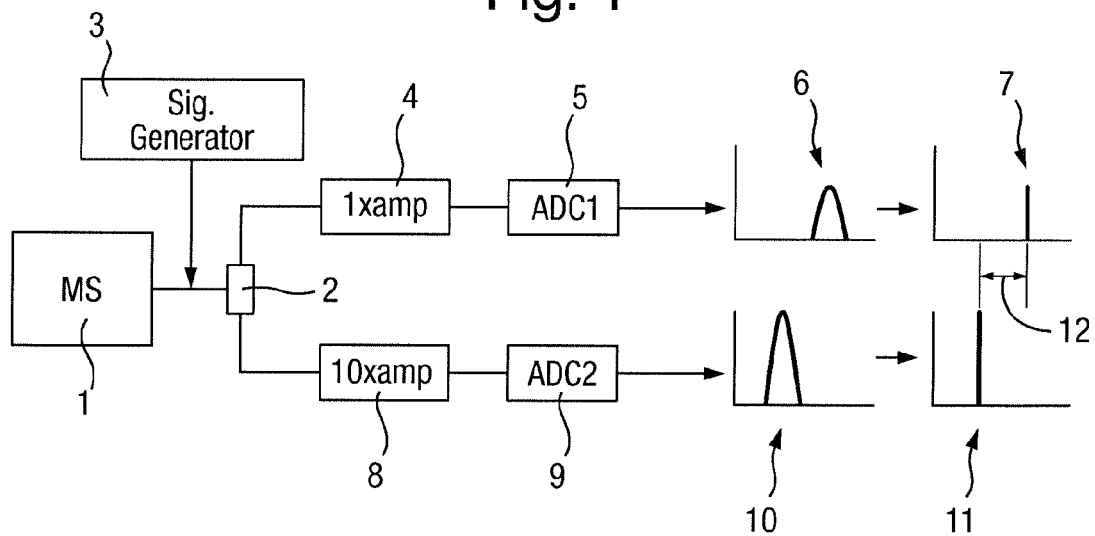
FIG. 1 shows a schematic representation of a preferred embodiment of the present invention.

FIG. 1 shows a schematic representation of a preferred embodiment of the present invention.

With reference to FIG. 1, a signal from the arrival of an ion or ions at the detector of a mass spectrometer 1 is split by an impedance matched splitter 2 into two separate signal paths with a substantially equal intensity of signal being directed to each signal path.

A calibration signal from a signal generator 3 is preferably injected into the signal line between the output of the mass spectrometer 1 and the splitter device 2. The test signal is preferably similar in line width to a signal which would be generated from ions striking the ion detector and should not exceed the dynamic range of the second ADC 9 when amplified by a high gain detector 8. It is generally advantageous for this signal, when amplified by the high gain detector 8, to be close to the maximum intensity allowed by the dynamic range of the ADC such that when passing through low gain amplifier 4 the resultant digitized signal from the low gain signal path 6 is of sufficient intensity to be accurately represented.

The test signal preferably passes through the splitter device 2. A portion of the signal travels down a signal path where it is amplified by a low gain amplifier 4 and is subsequently digitised by a first ADC 5 to produce a digitized signal 6. This digitized signal 6 is then processed to produce a time and intensity pair 7.

A second portion of the test signal travels down a different signal path where it is amplified by a high gain amplifier 8 and is subsequently digitised by a second ADC 9 to produce a digitized signal 10. This digitized signal 10 is then processed to produce a time intensity pair 11.

A time difference 12 or propagation delay is then preferably calculated from the two time intensity pairs and this time difference may be added to one of the time intensity pairs as appropriate to align subsequent data.

Time-intensity pairs from subsequent (real) digitized and peak detected ion arrivals can then be aligned using a correction factor which has been calculated based upon the time difference of the test signal. The time and intensity pairs, once corrected, are then preferably combined into a single mass spectrum. The time correction is preferably applied for every time of flight spectrum before the data from the two ADCs is combined.

In the example described above with reference to FIG. 1 a single digitized transient from both signal paths for the same test signal was used to calculate the correction factor in order to align the two ADC outputs. However, in practice, it is highly desirable to create a histogram or sum of many transients for both signal paths and to determine the time correction based upon this summed data. This method produces an average correction value which will take into account timing jitter which may be different between the two signal paths.

In the preferred method this correction factor is applied to individual time of flight spectra from a single acceleration pulse prior to summing. However, in a less preferred embodiment the correction may be applied to the final summed or combined spectra made up from a summation of more than one time of flight spectrum. The summed time of flight spectra from each signal path may then be subsequently combined into a single high dynamic range data set.

Figure 2:
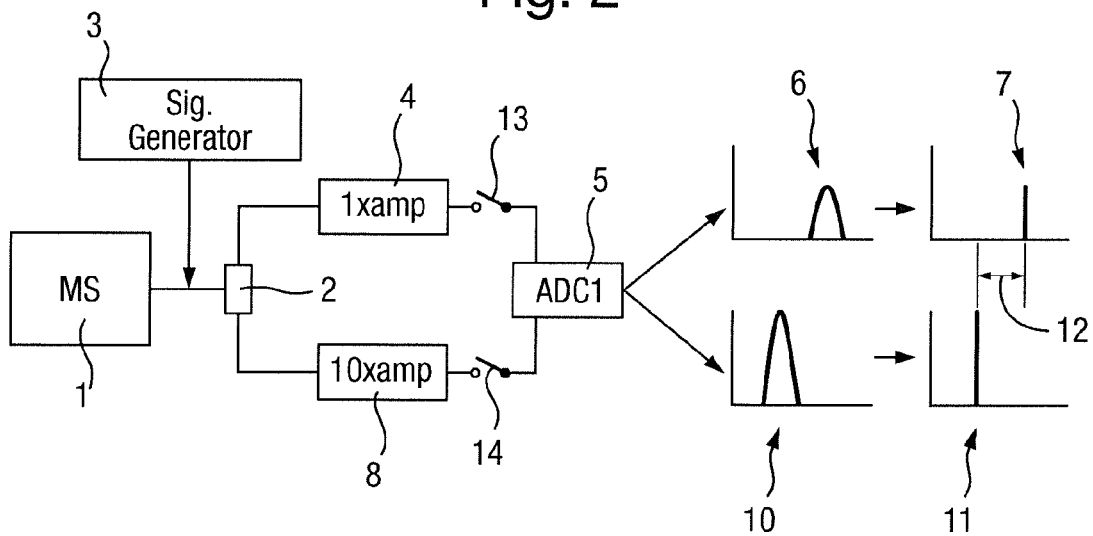
FIG. 2 shows how the output from a mass spectrometer may be split according to an embodiment of the present invention.

To illustrate the utility of the present invention the test system shown in FIG. 2 comprising a single ADC was used to obtain some data for illustrative purposes only. In this test system the incoming signal was split into two signal paths with different amplification stages and was digitised sequentially using the same 3 GHz 8 bit ADC 5. The input of the ADC 5 was switched between the first and second signal paths on a regular repeating interval. This allowed spectra to be built up by summing many thousands of individual time of flight spectra for each signal path in turn. Spectra from each signal path were then processed to calibrate the two streams of data in terms of time and intensity.

With reference to FIG. 2, the output of a quadrupole orthogonal acceleration Time of Flight mass spectrometer 1 was split into two separate signal paths using a Mini Circuits 2FRSC-183 S+, 18 MHz power splitter 2. To calibrate the system a test signal from a Stanford research DG535 pulse generator 3 was introduced in place of the input from the mass spectrometer 1.

One portion of the test signal was directed to a ORTEC 9306 1 GHz amplifier 8. The second portion of the signal was directed to a second ORTEC 9306 amplifier 4 fitted with a 20 dB input attenuator prior to the amplifier. This attenuator had the effect of reducing the total amplification provided by the (low) amplification stage 4 by a factor of approximately ×10 with respect to the other (high) amplification stage 8.

At the start of the acquisition a first switch 13 was arranged to be in a closed position and a second switch 14 was arranged to be in an open position. Signal from the lower amplification stage 4 was digitized 6, reduced to a time intensity pair 7 and recorded in memory. Subsequent pulses from the signal generator 3 were analysed in the same signal path and summed in memory to produce a spectrum.

After a period of approximately one second the first switch 13 was set to an open position and the second switch 14 was set to a closed position. Signal from the higher amplification stage 8 was digitized 10, reduced to a time intensity pair 11 and recorded in a separate summed spectrum for a further second.

This sequence was repeated every second to produce two series of spectra, one from the low gain signal path and one from the high gain signal path.

Figure 3:
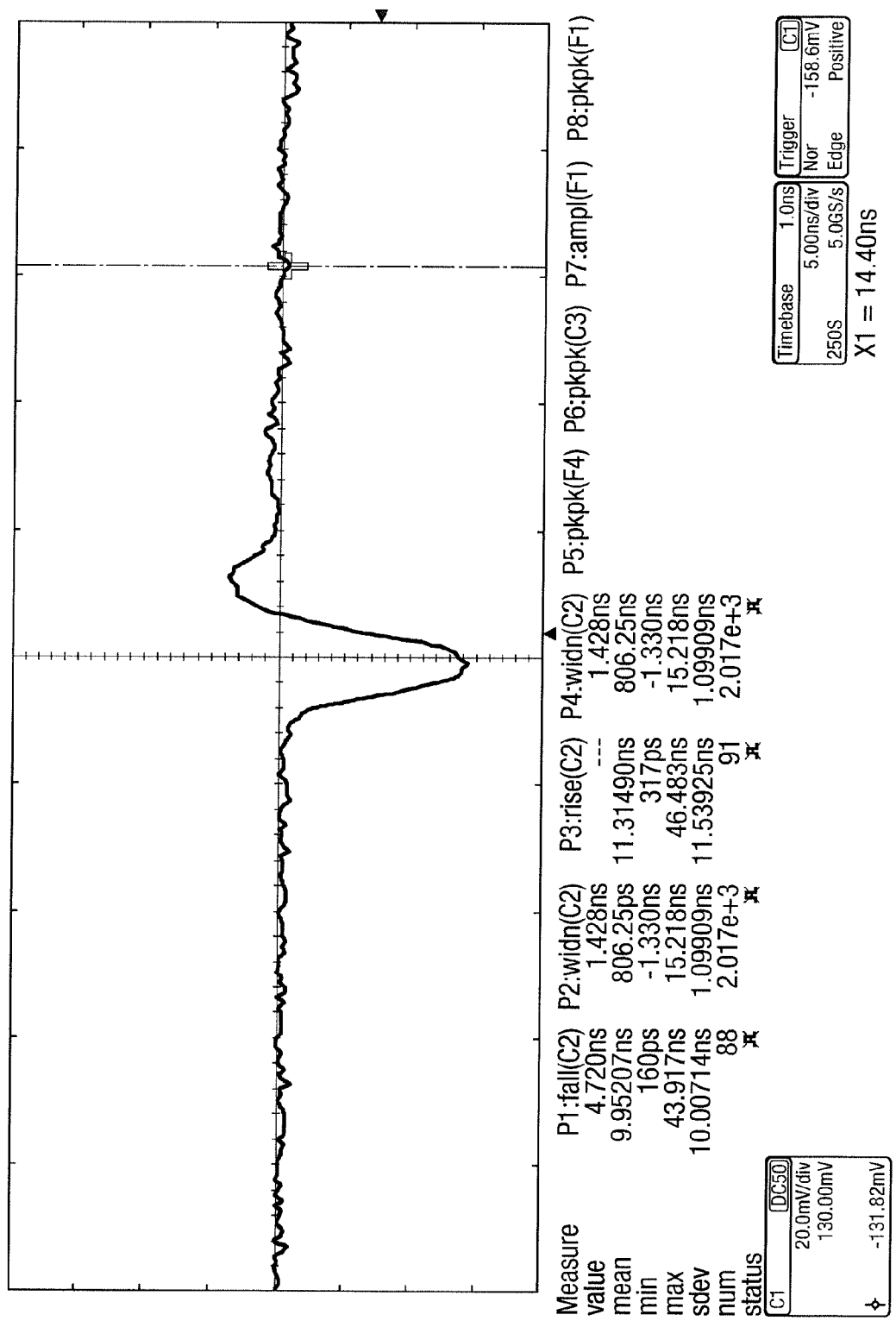
FIG. 3 shows an oscilloscope trace showing a test signal.

FIG. 3 shows an oscilloscope trace of the form of the test signal directly on the output of the signal generator 3. The signal generator 3 was set to produce a negative going signal with a pulse width of approximately 2.5 ns. The signal was made as symmetrical as possible in an effort to emulate the shape of an ion arrival envelope of the mass spectrometer. This ensured that any processing after digitisation had similar results for the test signal as the results which were expected for analyte ion arrival events.

The magnitude of the test signal was adjusted such that after amplification via the high gain signal path and subsequent digitization, the height of the most intense digitized sample was close to the maximum vertical range of the ADC. For the 8 bit ADC the maximum vertical least significant bit (LSB) is 255. In this case the signal was set to have a maximum of 225 LSBs. Setting the signal to this level ensured that in the low gain signal path sufficient intensity remained to accurately digitize the lower amplitude part of the signal.

For this example the test signal was set to appear at approximately 36 ps after the ADC 5 was triggered. This time is similar to the flight time of an ion having a mass to charge ratio of 556 in the geometry of mass spectrometer used. Subsequent calculation and application of the correction factor was performed close to this mass to charge ratio value to avoid errors.

According to the preferred embodiment all data was stored and corrected in time before conversion to mass.

Figure 4A:
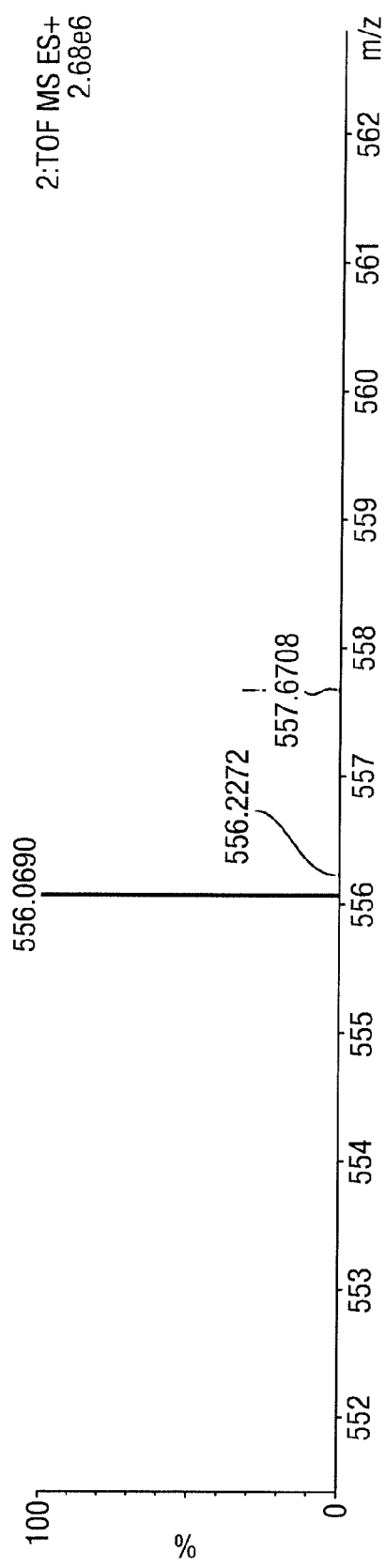
FIG. 4A shows a summed mass spectrum produced for a test signal via a low gain signal path and FIG. 4B shows a summed mass spectrum produced for a test signal via a high gain signal path.

FIG. 4A shows a summed spectrum produced for the test signal via the low gain signal path during a one second acquisition at a trigger repetition rate of 25,000 Hz.

Figure 4B:
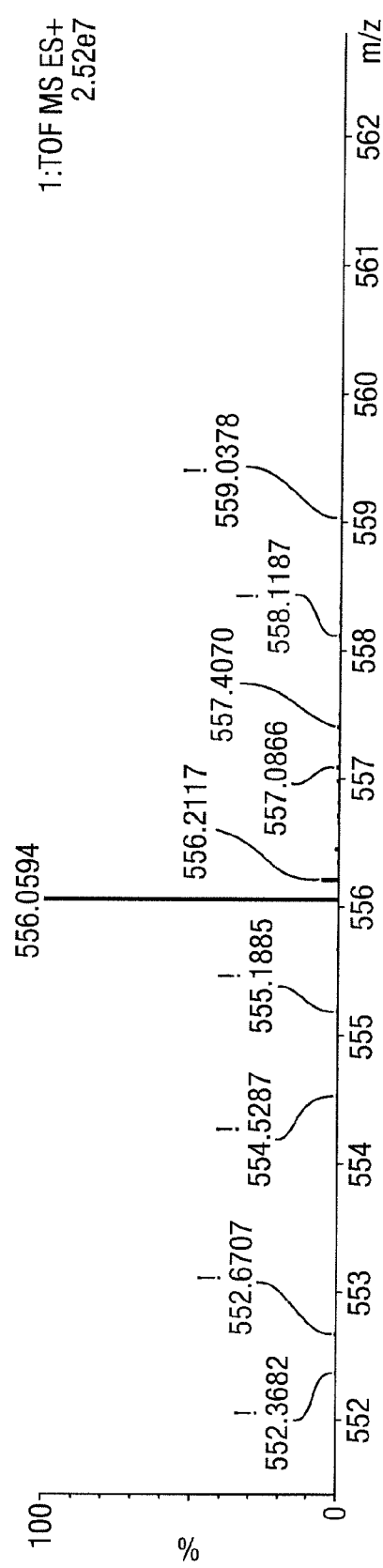

FIG. 4B shows a summed spectrum produced for the test signal via the high gain signal path during a one second acquisition at a trigger repetition rate of 25,000 Hz.

The ratio of intensity for high gain/low gain was $2.52 \times 10^7/2.68 \times 10^6 = 9.4$.

Therefore, the intensity correction factor which needs to be applied to the intensity from the low signal path is a multiplication factor of 9.4.

The ppm difference in the recorded mass to charge ratio values was 17.3 ppm. Therefore, to correct the mass to charge ratio scale in the low gain data path to the same value as in the high gain data path at a mass to charge ratio of approximately 556, 17.3 ppm should be subtracted from the mass to charge ratio recorded.

It will be understood that the timing or propagation delay between the two signal paths is essentially independent of the mass to charge ratio of ions being detected.

After the calibration was performed, the signal generator 3 was removed and the output of the mass spectrometer 1 was attached to the splitter 2 as shown in FIG. 2. A solution of Leucine Enkephalin was infused in positive ion Electrospray ionization mode. The intensity of the [M+H]+ ion at mass to charge ratio 556 was increased and decreased as the acquisition proceeded by adjusting the Electrospray capillary voltage. The intensity of the signal was then deliberately driven beyond the dynamic range of the ADC so that the correction factors calculated using the test signal could be tested.

Drift due to ambient temperature fluctuations was corrected by acquiring a separate single point "lock mass" at regular intervals during the acquisition. Lock mass spectra were acquired using the high gain amplifier signal path.

Figure 5A:
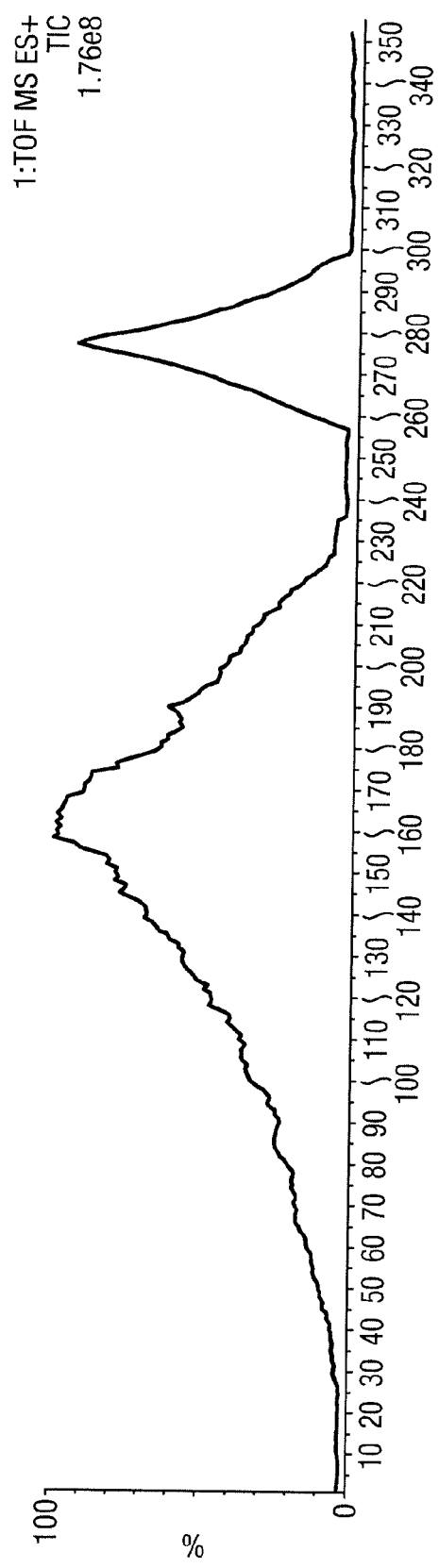
FIG. 5A shows a Total Ion Chromatogram from a high gain signal path and FIG. 5B shows a Total Ion Chromatogram from a low gain signal path.
Figure 5B:
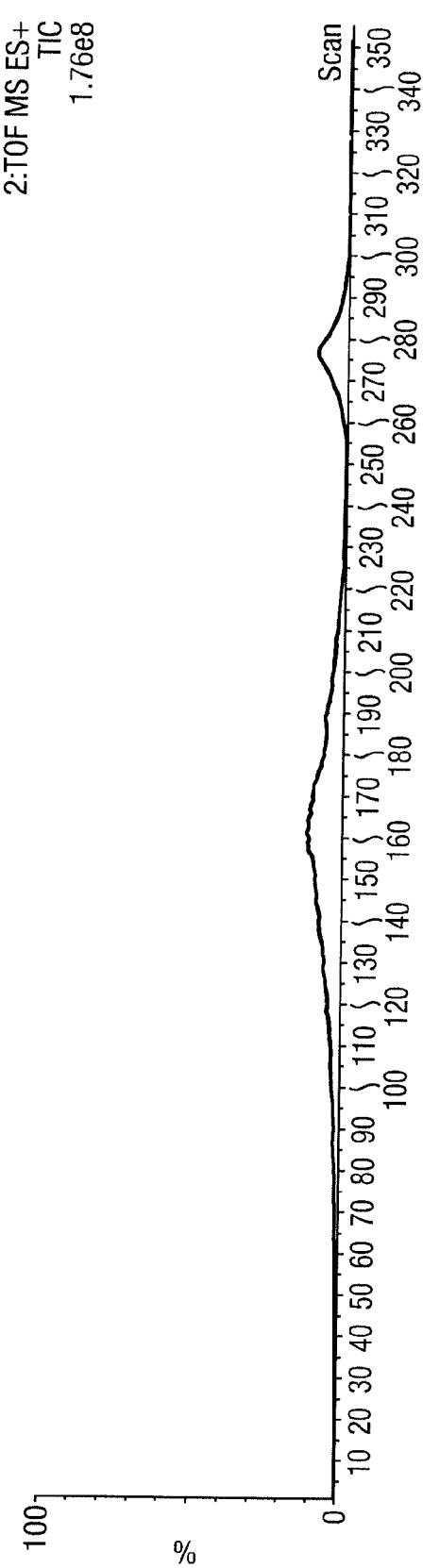

FIG. 5A shows the total ion current chromatogram (TIC) from the high gain signal path and FIG. 5B shown the total ion current chromatogram (TIC) from the low gain signal path.

FIG. 6A shows a single, one second duration, mass spectrum for the low gain signal path. FIG. 6B shows the mass spectrum acquired in one second for the high gain signal path directly after acquisition of the spectrum shown in FIG. 6A.

Figure 7:
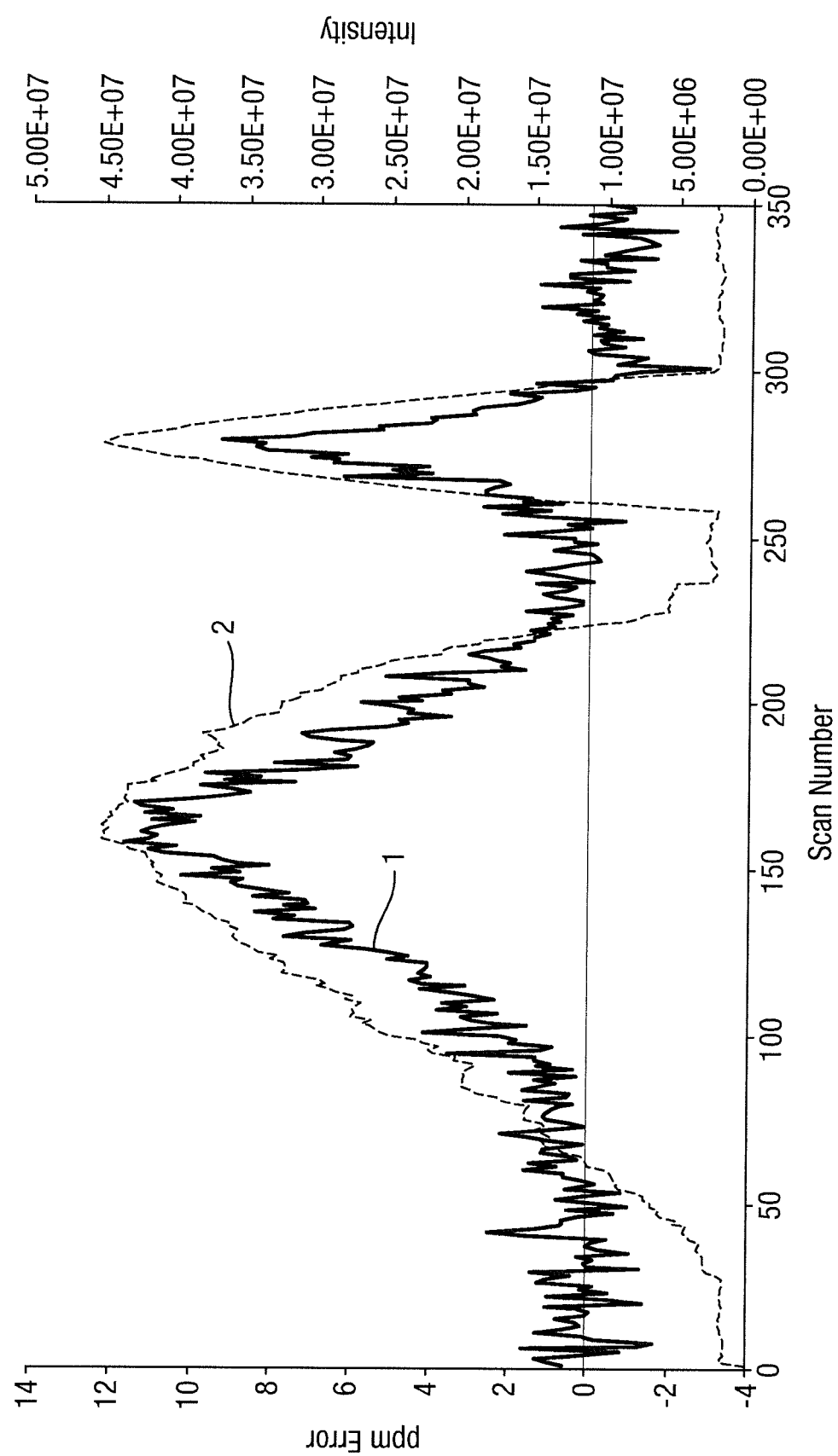
FIG. 7 shows a superimposed plot of ppm error in mass measurement and signal intensity for the high gain signal path.

FIG. 7 shows a superimposed plot of ppm error in mass measurement (left hand side y axis) 1 of the [M+H]+ peak of Leucine Enkephalin having a mass to charge ratio of 556.3 and the intensity (right hand side y axis) 2 of the [M+H]+ peak of Leucine Enkephalin having a mass to charge ratio of 556.3 versus scan number for the signal recorded from the high gain signal path.

It is apparent from FIG. 7 that below an intensity of $1 \times 10^7$ as indicated by the horizontal line shown in FIG. 7 the mass measurement error was less than approx. +/−1 ppm throughout the experiment. However, above an intensity of $1 \times 10^7$ the peak shifts towards high mass to charge ratio giving a positive mass measurement error. The maximum error was nearly 12 ppm at an intensity of $4.5 \times 10^7$. This shift in mass measurement is due to saturation of the ADC.

Figure 8:
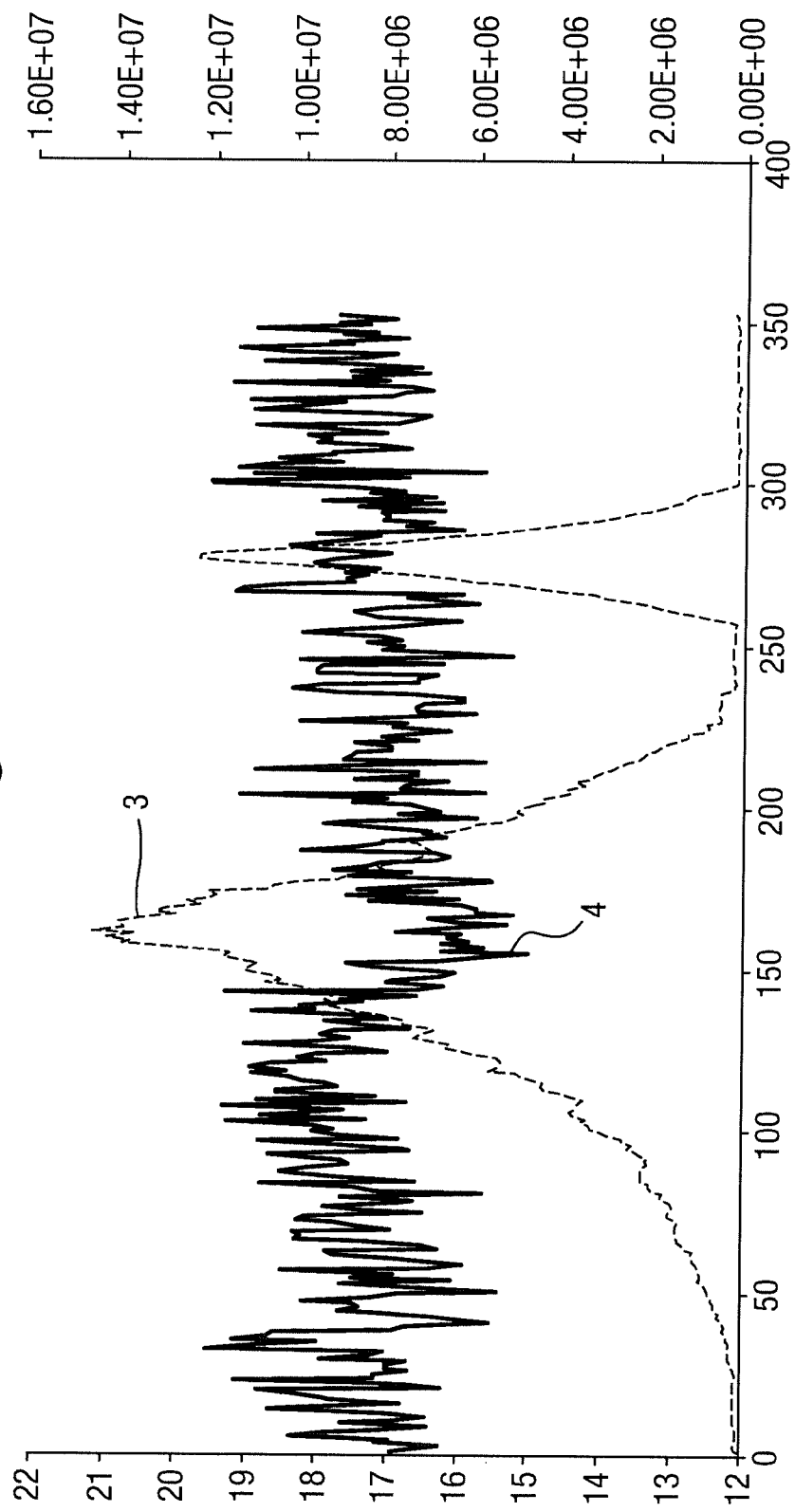
FIG. 8 shows a superimposed plot of ppm error in mass measurement and signal intensity for the low gain signal path.

FIG. 8 shows a corresponding superimposed plot of ppm error in mass measurement (left hand side y axis) 3 of the [M+H]+ peak of Leucine Enkephalin having a mass to charge ratio of 556.3 and the intensity (right hand side y axis) 4 of the [M+H]+ peak of Leucine Enkephalin having a mass to charge ratio of 556.3 versus scan number for the signal recorded from the low gain signal path.

The mean mass measurement error is approximately 17 ppm+/−1 ppm and there is little evidence of a mass shift within the statistical variation as the intensity increases. This is expected behaviour as the intensity does not rise above $1 \times 10^7$. This intensity did not give rise to a mass shift in FIG. 7.

Figure 9:
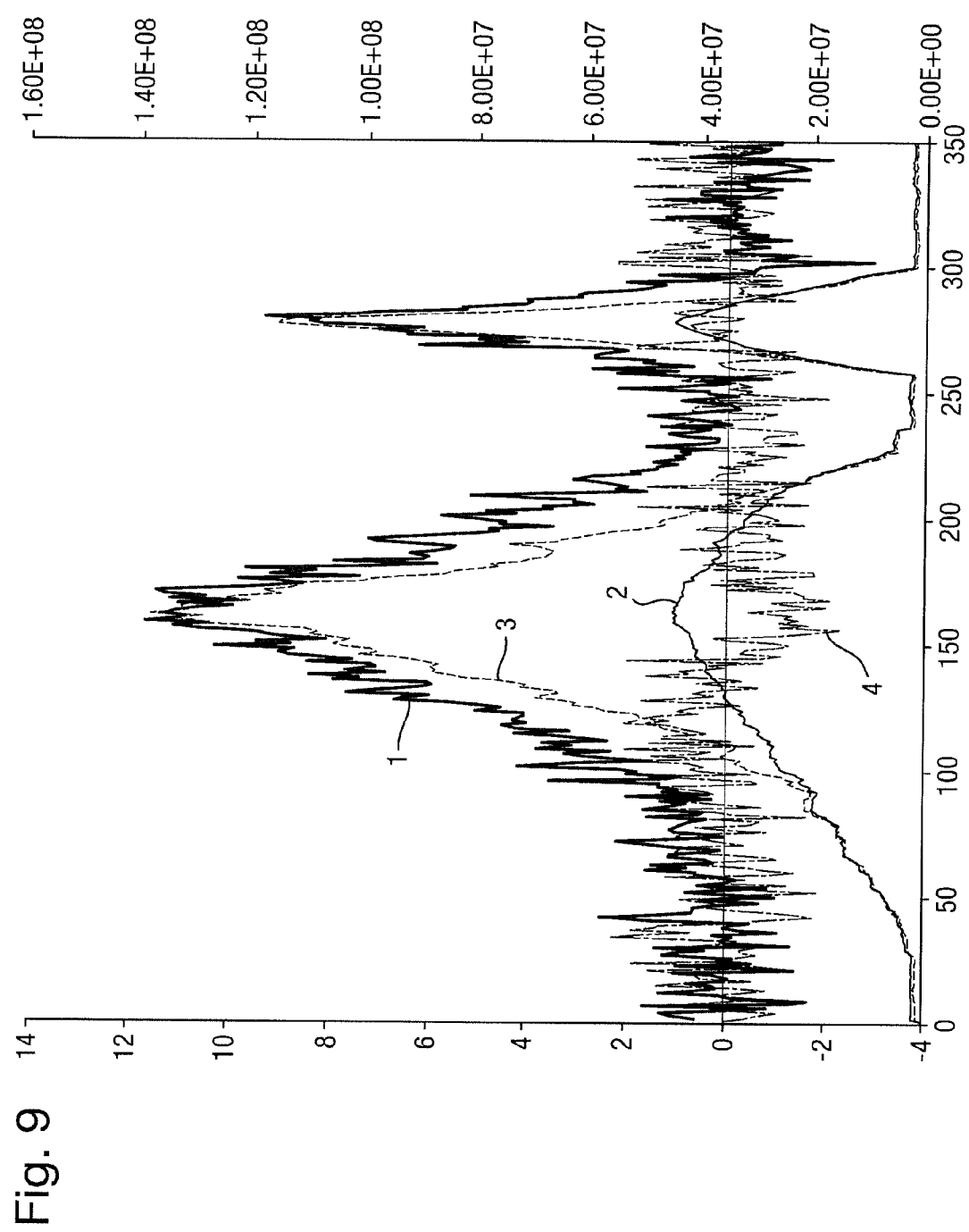
FIG. 9 shows both sets of mass error and intensity data superimposed after applying a correction according to a preferred embodiment of the present invention.

FIG. 9 shows both sets of mass error 1,4 and intensity data 2,3 superimposed after correcting the mass to charge ratio values and the intensity based on the correction factors determined from FIG. 4 and the method according to the preferred embodiment of the present invention.

The intensity 3 recorded from the low gain signal path is shown multiplied by 9.4. It follows the intensity 2 recorded from the high gain signal path until an intensity of around $1 \times 10^7$. This intensity is the point at which saturation of the ADC in the high gain signal path becomes significant both qualitatively and quantitatively. The ppm mass error 4 after subtraction of 17.4 ppm from the low gain data path result also follows the mass error 1 for the high gain data path until the onset of saturation in the high gain data.

Using a combination of the low and high gain data the dynamic range of the data set can be improved by over 10 times whilst still retaining detection limits at low intensity.

This data illustrates that the method of calibrating a dual gain ADC system using a test signal as described above in accordance with the preferred embodiment of the present invention provides sufficient accuracy in the mass accuracy and quantitative performance of a dual gain ADC.

The preferred method of calibration is also relevant to a gain switching Dynamic Range Enhancement ("DRE") method of operation such as that described in the example data given in this application. This method of operation is described in Micromass patent U.S. Pat. No. 7,038,197.

It should be stressed that although not preferred, it is within the scope of the present invention to use a calibrant compound ionized and analysed by the mass spectrometer to perform the calibration procedure. This still is advantageous over conventional arrangements since no phase correcting of the two ADCs is required.

In addition there is no requirement to align the signal such that each digitized point in the two signal paths corresponds to the same region of the ion signal before individual digitized points are chosen to represent the final signal. This reduces the complexity of operating such a system.

Although the present invention has been described with reference to preferred embodiments, it will be understood by those skilled in the art that various changes in form and detail may be made without departing from the scope of the invention as set forth in the accompanying claims.

The invention claimed is:

1. A method of mass spectrometry comprising:
   passing a test signal through a first signal path of a dual gain ADC detector system to determine a first time T1 for said first signal path;
   passing a test signal through a second signal path of said dual gain ADC detector system to determine a second time T2 for said second signal path;
   determining a time difference $\Delta T$ between said first time T1 and said second time T2;
   detecting analyte ions, wherein detecting said analyte ions comprises producing a first signal and a second signal, wherein said first signal corresponds with an ion detector signal multiplied or amplified by a first gain and said second signal corresponds with an ion detector signal multiplied or amplified by a second different gain;
   digitising said first signal using said dual gain ADC detector system to produce a first digitised signal and digitising said second signal using said dual gain ADC detector system to produce a second digitised signal, wherein there is a time delay between the first digitised signal produced by said dual gain ADC detector system and the second digitised signal produced by said dual gain ADC detector system;
   detecting one or more peaks in the first and second digitised signals produced by the dual gain ADC detector system for the detected analyte ions;
   determining an intensity value and an arrival time or time-dependent value for said one or more peaks; and
   correcting the arrival time or time-dependent value of said one or more peaks using the determined time difference $\Delta T$.

2. A method as claimed in claim 1, wherein:
   said first signal path comprises a low gain signal path; or
   said second signal path comprises a high gain signal path.

3. A method as claimed in claim 1, wherein:
   the test signal passing along said first signal path is multiplied or amplified by said first gain.

4. A method as claimed in claim 1, wherein the test signal passing along said second signal path is multiplied or amplified by said second different gain, wherein said second gain is greater than said first gain.

5. A method as claimed in claim 1, wherein either:
   (a) the ratio of said second different gain to said first gain is selected from the group consisting of: (i) <2; (ii) 2-5; (iii) 5-10; (iv) 10-15; (v) 15-20; (vi) 20-25; (vii) 25-30; (viii) 30-35; (ix) 35-40; (x) 40-45; (xi) 45-50; (xii) 50-60; (xiii) 60-70; (xiv) 70-80; (xv) 80-90; (xvi) 90-100; and (xvii) >100; or
   (b) the ratio of said first gain to said second different gain is selected from the group consisting of: (i) <2; (ii) 2-5; (iii) 5-10; (iv) 10-15; (v) 15-20; (vi) 20-25; (vii) 25-30; (viii) 30-35; (ix) 35-40; (x) 40-45; (xi) 45-50; (xii) 50-60; (xiii) 60-70; (xiv) 70-80; (xv) 80-90; (xvi) 90-100; and (xvii) >100.

6. A method as claimed in claim 1, further comprising:
   passing the test signal multiple times through the first signal path of the dual gain ADC detector system to produce first digitised test signals, processing each said first digitised test signal to detect a first test peak, determining a time or time-dependent value and an intensity value corresponding to each said first test peak, histogramming or combining each said time or time-dependent value and said intensity value to form a first histogram or combined data set and determining the first time T1 for said first signal path from said first histogram or combined data set; and
   passing the test signal multiple times through the second signal path of said dual gain ADC detector system to produce second digitised test signals, processing each said second digitised test signal to detect a second test peak, determining a time or time-dependent value and an intensity value corresponding to each said second test peak, histogramming or combining each said time or time-dependent value and said intensity value to form a second histogram or combined data set and determining the second time T2 for said second signal path from said second histogram or combined data set.

7. A method as claimed in claim 1, further comprising:
   detecting one or more first peaks in said first digitised signal and detecting one or more second peaks in said second digitised signal; and
   marking or flagging first peaks or second peaks which are determined to suffer from saturation.

8. A method as claimed in claim 7, further comprising:
   determining an intensity value and an arrival time or time-dependent value for each of said first peaks; and
   correcting the determined arrival time or time-dependent value of each of said first peaks based upon said time difference $\Delta T$.

9. A method as claimed in claim 7, further comprising:
   determining an intensity value and an arrival time or time-dependent value for each of said second peaks; and
   correcting the determined arrival time or time-dependent value of each said second peaks based upon said time difference $\Delta T$.

10. A method as claimed in claim 7, further comprising forming a combined data set comprising intensity values and arrival time or time-dependent values of each of said second peaks which are not marked or flagged as suffering from saturation and intensity values and arrival time or time-dependent values of first peaks when corresponding second peaks are marked or flagged as suffering from saturation.

11. A method as claimed in claim 10, further comprising correcting the arrival time or time-dependent value of each of said first peaks or said second peaks, based upon said time difference ΔT.

12. A method as claimed in claim 10, further comprising scaling the intensity values of said first peaks by a scale factor, wherein said scale factor corresponds with the ratio of said second gain to said first gain.

13. A method as claimed in claim 10, further comprising histogramming or combining the intensity values and arrival time or time-dependent values in said combined data set with further intensity values and arrival time or time-dependent values to form a mass spectrum.

14. A method as claimed in claim 1, further comprising summing said first digitised signal with a plurality of further corresponding first digitised signals to form a first summed digitised signal and summing said second digitised signal with a plurality of further corresponding second digitised signals to form a second summed digitised signal.

15. A method as claimed in claim 14, further comprising:
determining a first summed intensity value and a first summed arrival time or time-dependent value from said first summed digitised signal; or
determining a second summed intensity value and a second summed arrival time or time-dependent value from said second summed digitised signal.

16. A method as claimed in claim 14, further comprising either:
(i) marking or flagging first digitised signals or second digitised signals which are determined to suffer from saturation; or
(ii) marking or flagging first summed intensity values or second summed intensity values which are determined to suffer from saturation.

17. A method as claimed in claim 15, further comprising:
correcting the first summed arrival time or time-dependent value based upon said time difference ΔT; or
correcting the second summed arrival time or time-dependent value based upon said time difference ΔT.

18. A method as claimed in claim 15, further comprising forming a combined data set comprising second summed intensity values and second summed arrival time or time-dependent values which are not marked or flagged as suffering from saturation and first summed intensity values and first summed arrival time or time-dependent values when corresponding second digitised signals or second summed intensity values are marked or flagged as suffering from saturation.

19. A method as claimed in claim 18, further comprising:
correcting said first summed arrival times or time-dependent values based upon said time difference ΔT; or
correcting said second summed arrival times or time-dependent values based upon said time difference ΔT.

20. A method as claimed in claim 18, further comprising scaling said first summed intensity values by a scale factor, wherein said scale factor corresponds with the ratio of said second gain to said first gain.

21. A method as claimed in claim 18, further comprising histogramming or combining the intensity values and arrival time or time-dependent values in said combined data set with further intensity values and arrival time or time-dependent values to form a mass spectrum.

22. A method as claimed in claim 1, wherein the step of producing said first signal and said second signal comprises converting, splitting or dividing a signal output from an ion detector into said first signal and said second signal.

23. A method as claimed in claim 1, wherein the steps of digitising said first signal and digitising said second signal are performed substantially simultaneously.

24. A method as claimed in claim 1, wherein said dual gain ADC detector system is arranged to convert an analogue voltage to a digital output and wherein said dual gain ADC detector system is arranged:
(a) to operate, in use, at a digitisation rate selected from the group consisting of: (i) <1 GHz; (ii) 1-2 GHz; (iii) 2-3 GHz; (iv) 3-4 GHz; (v) 4-5 GHz; (vi) 5-6 GHz; (vii) 6-7 GHz; (viii) 7-8 GHz; (ix) 8-9 GHz; (x) 9-10 GHz; and (xi) >10 GHz; or
(b) to have a resolution selected from the group consisting of: (i) at least 4 bits; (ii) at least 5 bits; (iii) at least 6 bits; (iv) at least 7 bits; (v) at least 8 bits; (vi) at least 9 bits; (vii) at least 10 bits; (viii) at least 11 bits; (ix) at least 12 bits; (x) at least 13 bits; (xi) at least 14 bits; (xii) at least 15 bits; and (xiii) at least 16 bits.

25. A method as claimed in claim 1, further comprising:
determining an intensity difference or ratio between said first signal and said second signal; and:
using said determined intensity difference or ratio to correct subsequent intensity data produced by said dual gain ADC detector system.

26. A method as claimed in claim 1, further comprising using a single ion detector to detect said analyte ions.

27. A dual gain ADC detector system comprising:
a first signal path;
a second signal path; and
a control system arranged and adapted to:
(i) pass a test signal through said first signal path to determine a first time T1 for said first signal path;
(ii) pass a test signal through said second signal path to determine a second time T2 for said second signal path; and
(iii) determine a time difference ΔT between said first time T1 and said second time T2;
wherein the dual gain ADC detector system is arranged and adapted to:
(i) detect analyte ions, wherein detecting said analyte ions comprises producing a first signal and a second signal wherein said first signal corresponds with an ion detector signal multiplied or amplified by a first gain and said second signal corresponds with an ion detector signal multiplied or amplified by a second different gain;
(ii) digitise said first signal to produce a first digitised signal and digitise said second signal to produce a second digitised signal, wherein there is a time delay between the first digitised signal produced by said dual gain ADC detector system and the second digitised signal produced by said dual gain ADC detector system;
(iii) detect one or more peaks in the first and second digitised signals produced by the dual gain ADC detector system for the detected analyte ions;
(iv) determine an intensity value and an arrival time or time-dependent value for said one or more peaks; and
(v) correct the arrival time or time-dependent value of said one or more peaks using the determined time difference ΔT.

28. A method as claimed in claim 1, wherein said first signal is digitised using a first Analogue to Digital Converter so as to produce the first digitised signal and said second signal is digitised using a second different Analogue to Digital Converter so as to produce the second digitised signal.

29. A method as claimed in claim 28, wherein said first digitised signal output from said first Analogue to Digital Converter is not phase corrected with said second digitised signal output from said second Analogue to Digital Converter.

30. A method as claimed in claim 1, wherein said time-dependent value comprises a mass or mass to charge ratio value.

31. A method as claimed in claim 1, wherein said time delay between the first digitised signal produced by said dual gain ADC detector system and the second digitised signal produced by said dual gain ADC detector system comprises a propagation time delay.

* * * * *